(12) United States Patent
Yang et al.

(10) Patent No.: US 8,050,467 B2
(45) Date of Patent: Nov. 1, 2011

(54) PACKAGE, PACKAGING METHOD AND SUBSTRATE THEREOF FOR SLIDING TYPE THIN FINGERPRINT SENSOR

(75) Inventors: Charles Yang, Kaohsiung (TW); Yeh-Shun Chen, Kaohsiung (TW); Yung-Jen Chen, Kaohsiung (TW); Wei-Te Chu, Kaohsiung (TW); Tun-Yu Chen, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 883 days.

(21) Appl. No.: 11/902,176

(22) Filed: Sep. 19, 2007

(65) Prior Publication Data
US 2009/0073632 A1 Mar. 19, 2009

(51) Int. Cl.
*G06K 9/00* (2006.01)
(52) U.S. Cl. ....................................................... 382/124
(58) Field of Classification Search .......... 382/124–127; 283/68, 69; 356/71
See application file for complete search history.

(56) References Cited

U.S. PATENT DOCUMENTS

| | | | | |
|---|---|---|---|---|
| 6,330,145 | B1 * | 12/2001 | Lepert et al. | 361/220 |
| 6,437,583 | B1 * | 8/2002 | Tartagni et al. | 324/687 |
| 2001/0026636 | A1 * | 10/2001 | Mainguet | 382/124 |
| 2003/0035570 | A1 * | 2/2003 | Benkley, III | 382/124 |

* cited by examiner

*Primary Examiner* — Alex Liew
(74) *Attorney, Agent, or Firm* — Muncy, Geissler, Olds & Lowe, PLLC (57) ABSTRACT

A sliding type thin fingerprint sensor package mainly comprises a substrate and a fingerprint sensor chip. The chip defined as a sliding region and a conductive portion comprises a dielectric layer, a circuit layer and a passivation layer. The circuit layer has a plurality of external contact pads and at least one electrostatic conductive pad close to a window of the dielectric layer. The passivation layer formed on the circuit layer has a plurality of first openings to expose the external contact pads and a second opening to expose the electrostatic conductive pad of the circuit layer and the window of the dielectric layer. The electrostatic conductive pad and the window are located at the sliding region and the external contact pads are located at the conductive portion. The fingerprint sensor chip is electronically connected with the substrate. A sensing region of the fingerprint sensor chip is exposed via the second opening of the passivation layer and the window of the dielectric layer.

19 Claims, 7 Drawing Sheets

PACKAGE, PACKAGING METHOD AND SUBSTRATE THEREOF FOR SLIDING TYPE THIN FINGERPRINT SENSOR

FIELD OF THE INVENTION

The present invention relates generally to a package used for fingerprint sensor and it relates, more particularly, to a package used for sliding type thin fingerprint sensor.

BACKGROUND OF THE INVENTION

Figure 1:
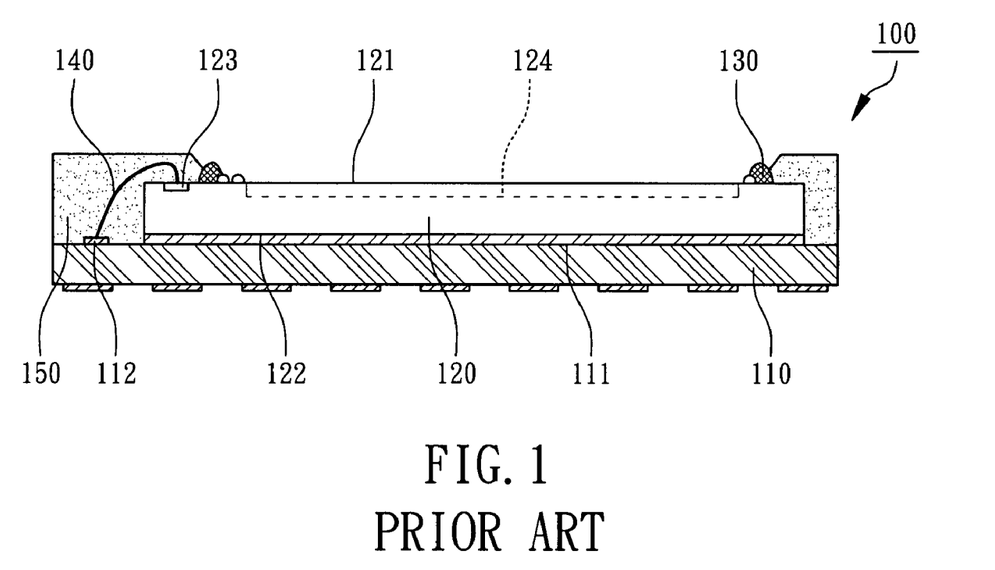
FIG. 1 is a cross-sectional view of a known sliding type thin fingerprint sensor package.

The well known used sliding type thin fingerprint sensor package 100, as illustrated in FIG. 1, includes a substrate 110, a fingerprint sensor chip 120, an electrostatic discharge bar 130, at least one bonding wire 140 and an encapsulant 150. The fingerprint sensor chip 120 has an active surface 121 forming a sensing region 124, a back surface 122 and at least one bonding pad 123 located at the exterior of the sensing region 124. The electrostatic discharge bar 130 is disposed on the active surface 121 of the fingerprint sensor chip 120 and located between the sensing region 124 and the bonding pad 123. The bonding wire 140 is applied for electrically connecting a connection pad 112 of the substrate 110 with the bonding pad 123 of the fingerprint sensor chip 120. The encapsulant 150 is formed on an upper surface 111 of the substrate 110 and the active surface 121 of the fingerprint sensor chip 120 so as to encapsulate the bonding wire 140 and exposes the sensing region 124 and the electrostatic discharge bar 130. However, the electrostatic discharge bar 130 of the sliding type thin fingerprint sensor package 100 is actually disposed on the active surface 121 of the fingerprint sensor chip 120, which will cause a complicated manufacturing process. Besides, it is found that the thickness of the sliding type thin fingerprint sensor package 100 cannot be reduced since the fingerprint sensor chip 120 is stacked on the substrate 110 to increase entire thickness of the substrate 110. In addition, since the encapsulant 150 is formed to encapsulate the bonding wire 140, the thickness of the known sliding type thin fingerprint sensor package 100 will be further raised and it is not allowed to encapsulate the electrostatic discharge bar 130 with the encapsulant 150 while forming the encapsulant 150.

SUMMARY OF THE INVENTION

An object of the present invention is to provide a sliding type thin fingerprint sensor package including a substrate and a fingerprint sensor chip. The substrate is defined as a sliding region and a conductive portion and has a circuit layer disposing a plurality of external contact pads, at least one internal contact pad and at least one electrostatic conductive pad close to a window located on a dielectric layer of the substrate. The substrate has a passivation layer disposing a plurality of first openings to expose the external contact pads and at least one second opening to expose the electrostatic conductive pad and the window of the dielectric layer, in which the electrostatic conductive pad and the window are located at the sliding region, the external contact pads are located at the conductive portion. The fingerprint sensor chip is electrically connected with the internal contact pad, and a sensing region of the fingerprint sensor chip is exposed via the second opening of the passivation layer and the window of the dielectric layer. In this invention, the electrostatic conductive pad on the circuit layer of the substrate is close to the sensing region of the fingerprint sensor chip and the second opening of the passivation layer exposes the electrostatic conductive pad of the circuit layer, the window of the dielectric layer and the sensing region of the fingerprint sensor chip, which may allow to electrostatic discharge through the electrostatic conductive pad located in the sliding region as finger touches the sliding region of the substrate as well as to reduce thickness and manufacturing cost of the sliding type thin fingerprint sensor package.

Another object of the present invention is to provide a sliding type thin fingerprint sensor package, which further includes a shell to cap a back surface of the fingerprint sensor chip. Besides, the conductive portion of the substrate covers the shell with bent sides thereof and the external contact pad is located under the shell to connect with external electronic element.

DETAILED DESCRIPTION OF THE INVENTION

Figure 2:
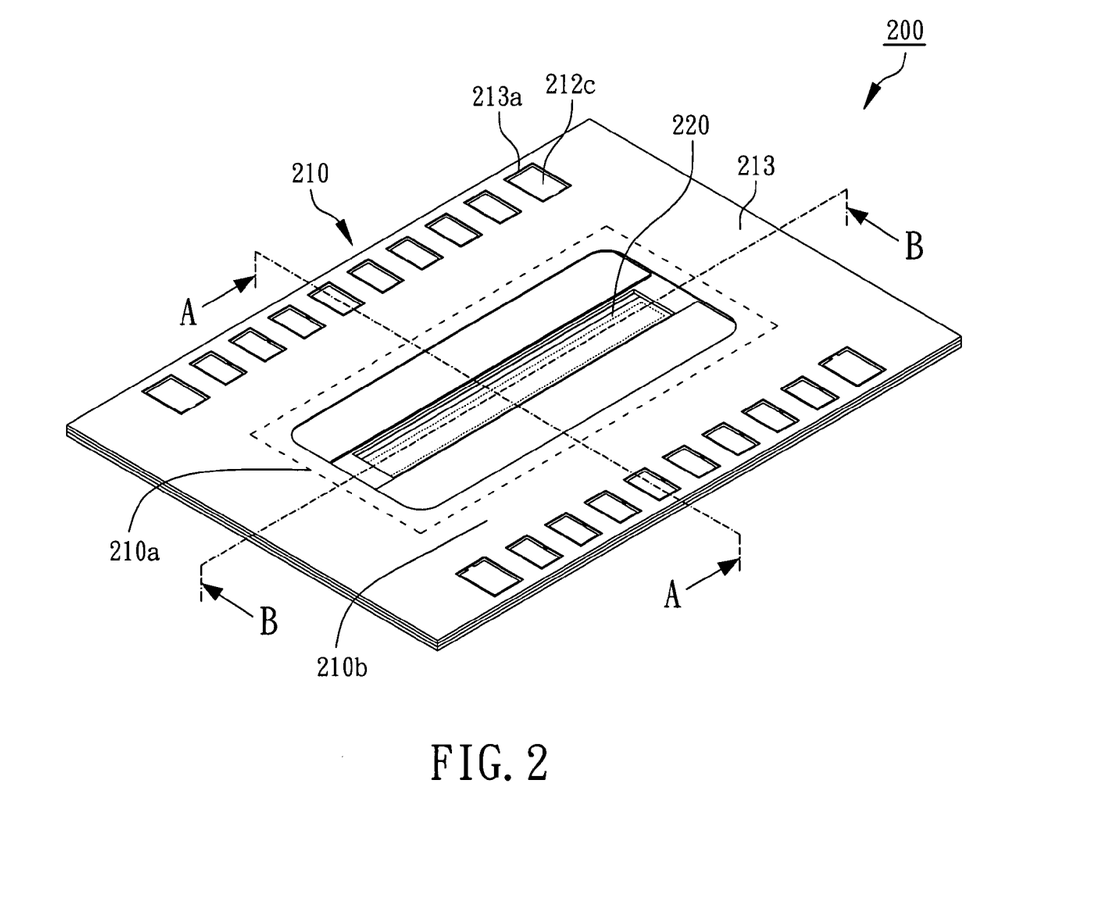
FIG. 2 is a perspective view of a sliding type thin fingerprint sensor package in accordance with a preferred embodiment of the present invention.
Figure 3:
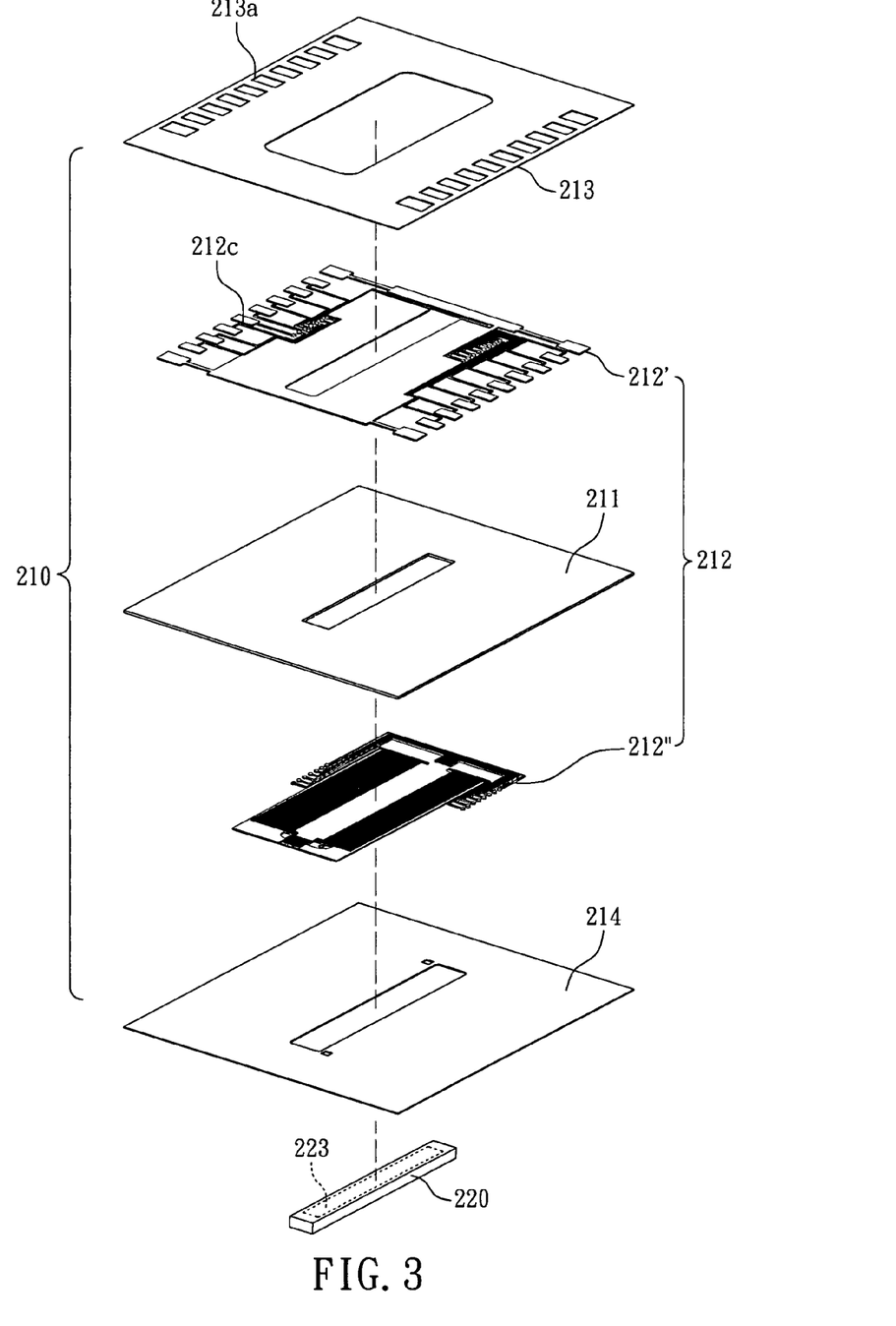
FIG. 3 is a perspective explosion view of the sliding type thin fingerprint sensor package in accordance with a preferred embodiment of the present invention.
Figure 4:
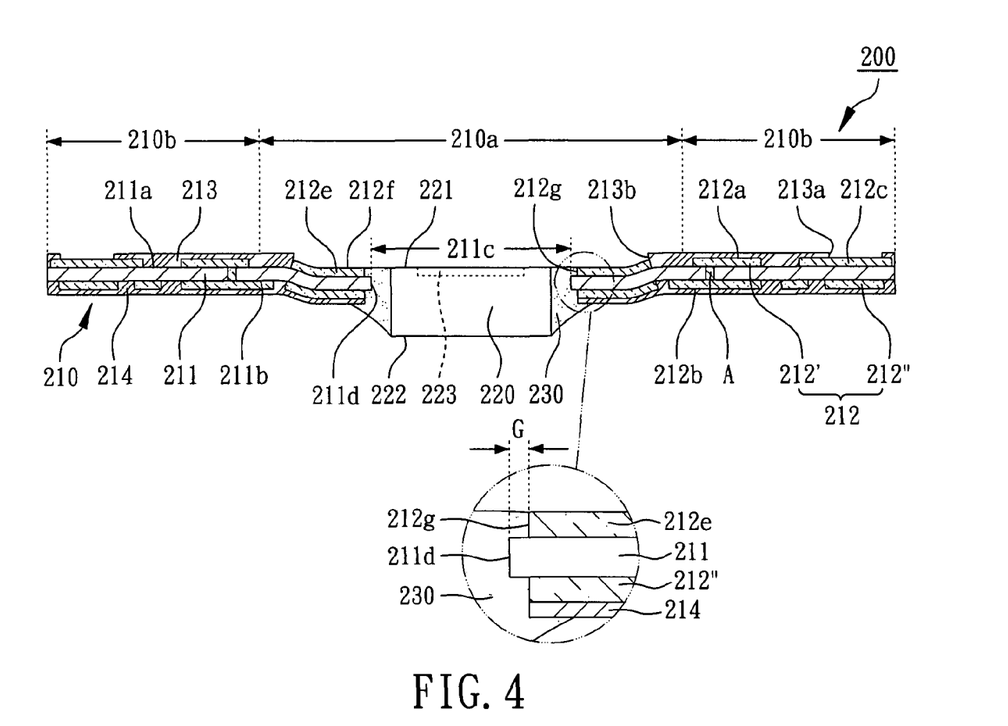
FIG. 4 is a cross-sectional view of the sliding type thin fingerprint sensor package along A-A direction of FIG. 2 in accordance with a preferred embodiment of the present invention.
Figure 5:
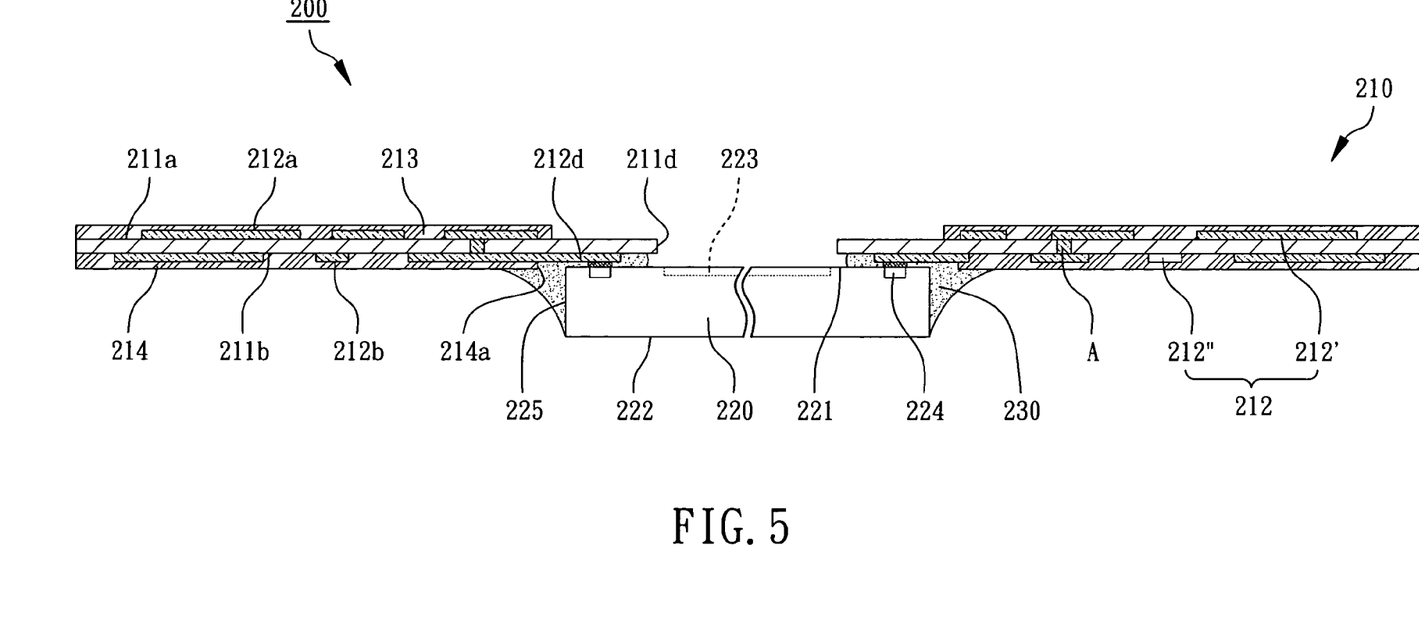
FIG. 5 is another cross-sectional view of the sliding type thin fingerprint sensor package along B-B direction of FIG. 2 in accordance with a preferred embodiment of the present invention.

Referring to FIG. 2 and FIG. 3, a sliding type thin fingerprint sensor package 200 is disclosed in accordance with a preferred embodiment of the present invention, which includes a substrate 210 and a fingerprint sensor chip 220. The substrate 210 defined as a sliding region 210a and a conductive portion 210b may adopt a print circuit board or flexible circuit board. In this embodiment, the substrate 210 has a dielectric layer 211, a circuit layer 212, a first passivation layer 213 and a second passivation layer 214, in which the dielectric layer 211 is made of polyimide and the circuit layer 212 is made of copper. As illustrated in FIGS. 2, 4 and 5, the dielectric layer 211 has an upper surface 211a, a lower surface 211b and a window 211c penetrating the upper and lower surfaces 211a, 211b. The circuit layer 212 has a first surface 212a, a second surface 212b, a plurality of external contact pads 212c, at least one internal contact pads 212d and at least one electrostatic conductive pad 212e, in which the external contact pads 212c and the electrostatic conductive pad 212e are formed on the upper surface 211a of the dielectric layer 211, the electrostatic conductive pad 212e is close to the window 211c of the dielectric layer 211, the electrostatic conductive pad 212e and the window 211c are located at the sliding region 210a of the substrate 210 and the external contact pads 212c are located at the conductive portion 210b of the substrate 210. In this embodiment, the circuit layer 212 includes a first circuit layer 212' formed on the upper surface 211a of the dielectric layer 211 and a second circuit layer 212" formed on the lower surface 211b of the dielectric layer 211, in which the first circuit layer 212' is electrically connected with the second circuit layer 212" via a through hole A, the first circuit layer 212' has the electrostatic conductive pad 212e and the external contact pads 212c, and the second circuit layer 212" has the internal contact pad 212d. The first passivation layer 213 formed on the first surface 212a of the circuit layer 212 has a plurality of first openings 213a and at least one second opening 213b, in which the second opening 213b is located at the sliding region 210a of the substrate 210 to expose the electrostatic conductive pad 212e and the window 211c of the dielectric layer 211, the first openings 213a expose the external contact pads 212c. The second passivation layer 214 formed on the second surface 212b of the circuit layer 212 has at least one third opening 214a to expose the internal contact pad 212d.

Referring again to FIGS. 4 and 5, the fingerprint sensor chip 220 has an active surface 221, a back surface 222, a sensing region 223 and at least one bump 224. The sensing region 223 is formed on the active surface 221 and exposed through the second opening 213b and the window 211c. The bump 224 is also formed on the active surface 221 and placed at the exterior of the sensing region 223 and electrically connected with the internal contact pad 212d, for example, ACP (Anisotropic Conductive Paste) or NCP (Non-Conductive Paste) may be applied to electrically connect the bump 224 with the internal contact pad 212d. An exposed surface 212f of the electrostatic conductive pad 212e may preferably be aligned with the active surface 221 of the fingerprint sensor chip 220, which is advantageous to electrostatic discharge via the electrostatic conductive pad 212e located at the sliding region 210a when finger touches the sliding region 210a of the substrate 210 and the sensing region 223 of the fingerprint sensor chip 220. Besides, the window 211c of the dielectric layer 211 has a ring-like wall 211d and the electrostatic conductive pad 212e has a side wall 212g, in which either there is an interval G between the ring-like wall 211d and the side wall 212g greater than 50 micron or the ring-like wall 211d is placed in aligned relationship with the side wall 212g in another embodiment. Moreover, the sliding type thin fingerprint sensor package 200 further has an underfilling material 230 formed between the substrate 210 and the fingerprint sensor chip 220 to encapsulate the bump 224. In this invention, the substrate 210 is relatively thinner and the external contact pads 212c as well as the electrostatic conductive pad 212c coexist on the circuit layer 212 of the substrate 210, so that it is possible to reduce extra cost for disposing electrostatic conductive bar and to thin the fingerprint sensor package.

Figure 6:
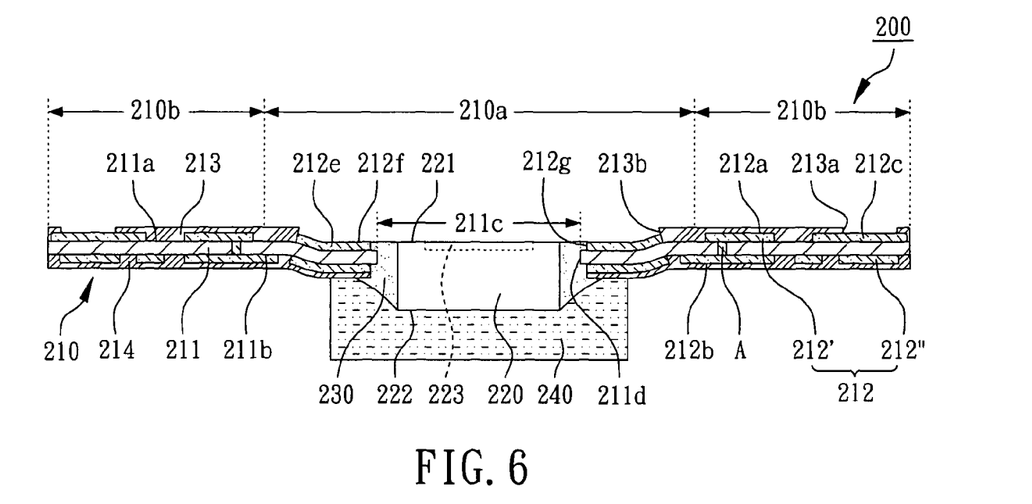
FIG. 6 is a cross-sectional view of the sliding type thin fingerprint sensor package with a shell in accordance with a preferred embodiment of the present invention.
Figure 7:
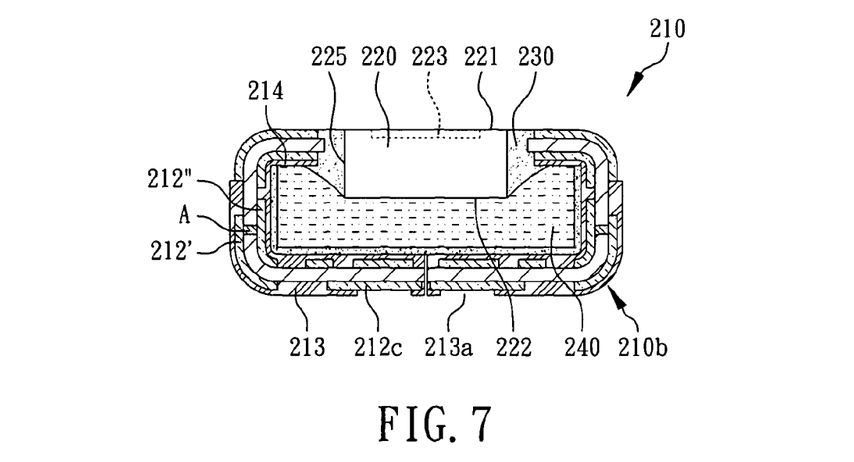
FIG. 7 is a cross-sectional view showing that the conductive portion of the sliding type thin fingerprint sensor package covers the chip with two bent sides thereof in accordance with a preferred embodiment of the present invention.
Figure 8:
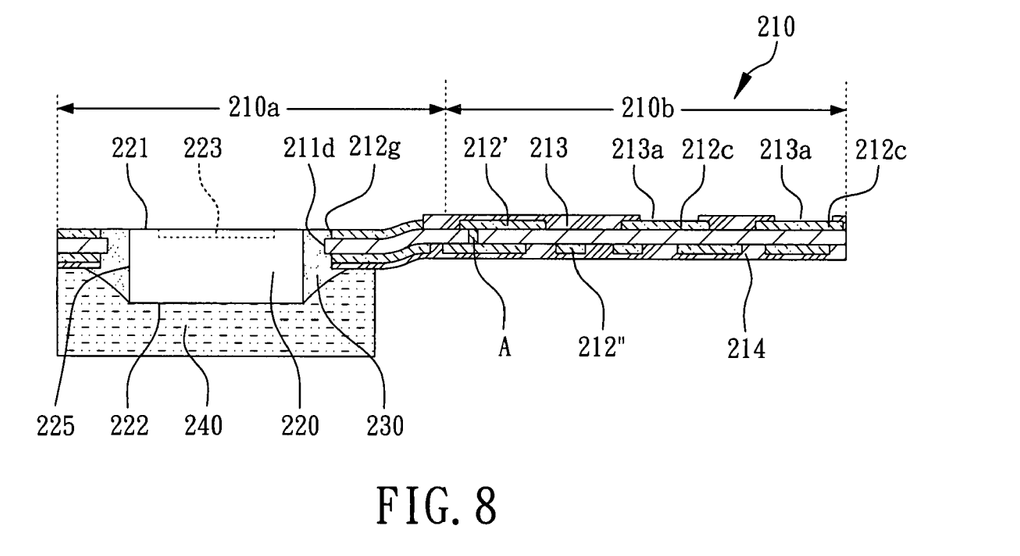
FIG. 8 is a cross-sectional view showing that the external contact pads of the sliding type thin fingerprint sensor package are placed at a same lateral in accordance with a preferred embodiment of the present invention.
Figure 9:
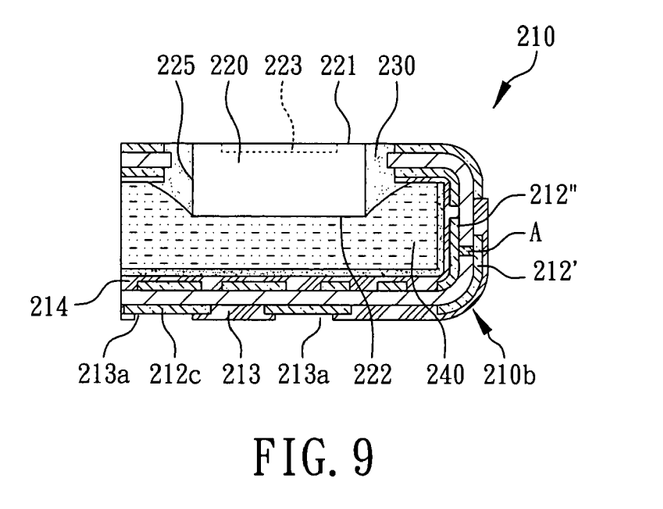
FIG. 9 is a cross-sectional view showing that the conductive portion of the sliding type thin fingerprint sensor package covers the chip with one bent side thereof in accordance with a preferred embodiment of the present invention.

Referring to FIG. 6, the sliding type thin fingerprint sensor package 200 may preferably further include a shell 240 to at least cap the back surface 222 of the fingerprint sensor chip 220. In this embodiment, the fingerprint sensor chip 220 further has a lateral surface 225 capped by the shell 240. The shell 240 is made of polymeric material such as encapsulant or metal material such as metal cover. As illustrated in FIGS. 6 and 7, in this embodiment, the substrate 210 can adopt either flexible substrate of TCP (Tape Carrier Package) or flexible substrate of COF (Chip-On-Film) package and the external contact pads 212c of the substrate 210 are placed at two sides of the substrate 210. The conductive portion 210b covers the shell 240 with two bent sides thereof that makes the external contact pads 212c be located under the shell 240. Alternatively, as illustrated in FIGS. 8 and 9, the external contact pads 212c of the substrate 210 are placed at a same side of the substrate 210 and the conductive portion 210b covers the shell 240 with a bent side only thereof that makes the external contact pads 212c be located under the shell 240.

A packaging method for the sliding type thin fingerprint sensor is disclosed in accordance with a preferred embodiment of the present invention, which includes the following steps. First of all, referring to FIGS. 2, 3 and 4, a substrate 210 is defined as a sliding region 210a and a conductive portion 210b is provided, which includes a dielectric layer 211, a circuit layer 212 and a first passivation layer 213. The dielectric layer 211 has an upper surface 211a, a lower surface 211b and a window 211c penetrating the upper surface 211a and the lower surface 211b. The circuit layer 212 has a first surface 212a, a second surface 212b, a plurality of external contact pads 212c, at least one internal contact pad 212d and at least one electrostatic conductive pad 212e, in which the external contact pads 212c and the electrostatic conductive pad 212e are formed on the upper surface 211a of the dielectric layer 211 and the electrostatic conductive pad 212e is close to the window 211c of the dielectric layer 211, the electrostatic conductive pad 212e and the window 211c are located at the sliding region 210a of the substrate 210, and the external contact pads 212c are located at the conductive portion 210b of the substrate 210. In this embodiment, the circuit layer 212 includes a first circuit layer 212' formed on the upper surface 211a of the dielectric layer 211 and a second circuit layer 212" formed on the lower surface 211b of the dielectric layer 211. The first passivation layer 213 formed on the first surface 212a of the circuit layer 212 has a plurality of first openings 213a for exposing the external contact pads 212c and at least one second opening 213b for exposing the electrostatic conductive pad 212e and the window 211c of the dielectric layer 211. Besides, the substrate 210 further has a second passivation layer 214 formed on the second surface 212b of the circuit layer 212. The second passivation layer 214 has at least one third opening 214a for exposing the internal contact pad 212d. Next, a fingerprint sensor chip 220 is provided, which is electrically connected with the internal contact pad 212d and has an active surface 221, a back surface 222 and a sensing region 223. The sensing region 223 is formed on the active surface 221 and exposed via the second opening 213b of the first passivation layer 213 and the window 211c of the dielectric layer 211. Then, after the bump is electrically connected with the internal contact pad 212d, an underfilling material 230 is formed between the substrate 210 and the fingerprint sensor chip 220 to encapsulate the bump 224. Otherwise, a shell 240 may be formed on the fingerprint sensor chip 220 so as to encapsulate at least the back surface 222 of the fingerprint sensor chip 220. In this embodiment, a lateral 225 of the fingerprint sensor chip 220 is also encapsulated by the shell 240. The shell 240 is made of polymeric material such as encapsulant or metal material such as metal cover and formed by dispensing or molding method. Otherwise, a metal cover may be directly capped on the back surface 222 and the lateral 225 of the fingerprint sensor chip 220 as a shell. Finally, it is able to bend the conductive portion 210b of the substrate 210 for covering the shell 240 and allow the external contact pads 212c to be located under the shell 240 serving for connecting with an external electronic element or circuit board. Wherein, the external contact pads 210b of the substrate 210 can be placed at two sides or one side of the substrate 210, so that the conductive portion 210b of the substrate 210 can cover the shell 240 with two or one bent side(s).

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A sliding type thin fingerprint sensor package comprising:
    a substrate defined as a sliding region and a conductive portion, the substrate comprising:
    a dielectric layer having an upper surface, a lower surface and a window penetrating the upper surface and the lower surface;
    a circuit layer having a first surface, a second surface, a plurality of external contact pads, at least one internal contact pad and at least one electrostatic conductive pad, wherein the external contact pads and the electrostatic conductive pad are formed on the upper surface of the dielectric layer, the electrostatic conductive pad is close to the window of the dielectric layer; and
    a first passivation layer formed on the first surface of the circuit layer, the first passivation layer having a plurality of first openings to expose the external contact pads and at least one second opening to expose the electrostatic conductive pad and the window of the dielectric layer;
    wherein the electrostatic conductive pad and the window are located at the sliding region, the external contact pads are located at the conductive portion; and
    a fingerprint sensor chip electrically connected with the internal contact pad, the fingerprint sensor chip having an active surface, a back surface and a sensing region formed on the active surface and exposed via the second opening of the first passivation layer and the window of the dielectric layer.

2. The sliding type thin fingerprint sensor package in accordance with claim 1, wherein the window of the dielectric layer has a ring-like wall, the electrostatic conductive pad has a side wall, an interval between the ring-like wall and the side wall is greater than 50 micron.

3. The sliding type thin fingerprint sensor package in accordance with claim 1, wherein the substrate further has a second passivation layer formed on the second surface of the circuit layer, the second passivation layer has at least one third opening for exposing the internal contact pad.

4. The sliding type thin fingerprint sensor package in accordance with claim 1, wherein the circuit layer includes a first circuit layer formed on the upper surface of the dielectric layer and a second circuit layer formed on the lower surface of the dielectric layer, the first circuit layer has the electrostatic conductive pad and the external contact pads, the second circuit layer has the internal contact pad.

5. The sliding type thin fingerprint sensor package in accordance with claim 1, wherein the fingerprint sensor chip has at least one bump formed on the active surface and located at the exterior of the sensing region, the bump is electrically connected with the internal contact pad.

6. The sliding type thin fingerprint sensor package in accordance with claim 5, further comprising an underfilling material formed between the substrate and the fingerprint sensor chip to encapsulate the bump.

7. The sliding type thin fingerprint sensor package in accordance with claim 1, further comprising a shell to at least cap the back surface of the fingerprint sensor chip.

8. The sliding type thin fingerprint sensor package in accordance with claim 7, wherein the fingerprint sensor chip further has a lateral capped by the shell.

9. The sliding type thin fingerprint sensor package in accordance with claim 1, wherein the shell is made of polymeric material or metal material.

10. The sliding type thin fingerprint sensor package in accordance with claim 7, wherein the conductive portion of the substrate covers the shell with bent sides thereof, at least one external contact pad is located under the shell.

11. The sliding type thin fingerprint sensor package in accordance with claim 1, wherein the substrate adopts either flexible substrate of TCP or flexible substrate of COF package.

12. A substrate for sliding type thin fingerprint sensor package defined as a sliding region and a conductive portion, which comprising:
    a dielectric layer having an upper surface, a lower surface and a window penetrating the upper surface and the lower surface;
    a circuit layer having a first surface, a second surface, a plurality of external contact pads, at least one internal contact pad and at least one electrostatic conductive pad, wherein the external contact pads and the electrostatic conductive pad are formed on the upper surface of the dielectric layer, the electrostatic conductive pad is close to the window of the dielectric layer; and
    a first passivation layer formed on the first surface of the circuit layer, the first passivation layer having a plurality of first openings to expose the external contact pads and at least one second opening to expose the electrostatic conductive pad and the window of the dielectric layer;
    wherein the electrostatic conductive pad and the window are located at the sliding region, the external contact pads are located at the conductive portion, and
    wherein the circuit layer includes a first circuit layer formed on the upper surface of the dielectric layer and a second circuit layer formed on the lower surface of the dielectric layer, the first circuit layer has the electrostatic conductive pad and the external contact pads, the second circuit layer has the internal contact pad.

13. The substrate for sliding type thin fingerprint sensor package in accordance with claim 12, wherein the window of the dielectric layer has a ring-like wall, the electrostatic conductive pad has a side wall, an interval between the ring-like wall and the side wall is greater than 50 micron.

14. The substrate for sliding type thin fingerprint sensor package in accordance with claim 12, wherein the substrate further has a second passivation layer formed on the second surface of the circuit layer, the second passivation layer has at least one third opening for exposing the internal contact pad.

15. The substrate for sliding type thin fingerprint sensor package in accordance with claim 12, wherein the substrate adopts either flexible substrate of TCP or flexible substrate of COF package.

16. A packaging method for sliding type thin fingerprint sensor package comprising the steps of:
    providing a substrate, the substrate defined as a sliding region and a conductive portion and comprising:
    a dielectric layer having an upper surface, a lower surface and a window penetrating the upper surface and the lower surface;
    a circuit layer having a first surface, a second surface, a plurality of external contact pads, at least one internal contact pad and at least one electrostatic conductive pad, wherein the external contact pads and the electrostatic conductive pad are formed on the upper surface of the dielectric layer, the electrostatic conductive pad is close to the window of the dielectric layer; and a first passivation layer formed on the first surface of the circuit layer, the first passivation layer having a plurality of first openings to expose the external contact pads and at least one second opening to expose the electrostatic conductive pad and the window of the dielectric layer;

wherein the electrostatic conductive pad and the window are located at the sliding region, the external contact pads are located at the conductive portion; and providing a fingerprint sensor chip, the fingerprint sensor chip being electrically connected with the internal contact pad, the fingerprint sensor chip having an active surface, a back surface and a sensing region formed on the active surface and exposed via the second opening of the first passivation layer and the window of the dielectric layer.

17. The packaging method for sliding type thin fingerprint sensor package in accordance with claim 16, further comprising a step of:

forming an underfilling material formed between the substrate and the fingerprint sensor chip to encapsulate the bump.

18. The packaging method for sliding type thin fingerprint sensor package in accordance with claim 16, further comprising a step of:

forming a shell at the chip to at least cap the back surface of the fingerprint sensor chip.

19. The packaging method for sliding type thin fingerprint sensor package in accordance with claim 16, further comprising a step of:

bending the conductive portion of the substrate to cover the shell, at least one external contact pad is located under the shell.

* * * * *